(12) United States Patent
Takada et al.

(10) Patent No.: US 9,989,687 B2
(45) Date of Patent: Jun. 5, 2018

(54) WAVE PLATE HAVING CONSISTENT BIREFRINGENCE PROPERTIES ACROSS THE VISIBLE SPECTRUM AND MANUFACTURING METHOD FOR SAME

(75) Inventors: Akio Takada, Miyagi (JP); Takatoshi Yamada, Miyagi (JP); Nobuyuki Koike, Miyagi (JP); Masatoshi Sasaki, Miyagi (JP); Kazuyuki Shibuya, Miyagi (JP)

(73) Assignee: DEXERIALS CORPORATION, Tokyo (JP)

( * ) Notice: Subject to any disclaimer, the term of this patent is extended or adjusted under 35 U.S.C. 154(b) by 183 days.

(21) Appl. No.: 13/699,830

(22) PCT Filed: May 25, 2010

(86) PCT No.: PCT/JP2010/058835
§ 371 (c)(1),
(2), (4) Date: Feb. 7, 2013

(87) PCT Pub. No.: WO2011/148465
PCT Pub. Date: Jan. 21, 2011

(65) Prior Publication Data
US 2013/0135727 A1    May 30, 2013

(51) Int. Cl.
G02B 5/30    (2006.01)
C23C 16/40    (2006.01)

(52) U.S. Cl.
CPC ............ G02B 5/3083 (2013.01); C23C 16/40 (2013.01); G02B 5/30 (2013.01); G02B 5/3025 (2013.01)

(58) Field of Classification Search
CPC ....... C23C 16/22; C23C 16/40; G02B 5/3083; G02B 1/08; G02B 5/30; G02B 5/3008; G02B 5/32

(Continued)

(56) References Cited

U.S. PATENT DOCUMENTS

| 6,590,707 B1* | 7/2003 | Weber ............................. 359/361 |
| 7,079,209 B2* | 7/2006 | Nakagawa .................... 349/119 |

(Continued)

FOREIGN PATENT DOCUMENTS

| JP | A-11-23840 | 1/1999 |
| JP | A-11-250483 | 9/1999 |
| WO | WO 2004/113974 A1 | 12/2004 |

OTHER PUBLICATIONS

Masuda et al., "Super Wide-Band Polymeric Quarter Wave Plates (QWPs) Fabricated by Nanoimprint Technologies," *Konica Minolta Technology Report*, 2008, vol. 5, pp. 101-106 (with Abstract).

(Continued)

*Primary Examiner* — Stephone B Allen
*Assistant Examiner* — Ryan S Dunning
(74) *Attorney, Agent, or Firm* — Oliff PLC

(57) ABSTRACT

A wave plate capable of increasing a birefringence quantity and being made into a thin film, and a method of manufacturing the wave plate. The wave plate includes a substrate, whereon convex portions and concave portions are formed with a period less than or equal to the wavelength of light that is used therewith, columnar portions, wherein fine grains of a dielectric material are layered by oblique vapor deposition of a dielectric material from two directions, in a columnar shape on the convex portions in the vertical direction relative to the surface of the substrate, and interstices that are located on the concave portions and disposed between the columnar portions. Using birefringence from the fine grains of the dielectric material and birefringence from the concave/convex portions of the substrate allows increasing the birefringence quantity and making a thin film.

3 Claims, 25 Drawing Sheets

(58) Field of Classification Search
USPC ....... 359/489.07; 427/162; 349/96–103, 161, 349/162
See application file for complete search history.

(56) References Cited

U.S. PATENT DOCUMENTS

| | | | |
|---|---|---|---|
| 2004/0067001 A1* | 4/2004 | Vodrahalli ......... | G02B 6/12011 385/11 |
| 2007/0195272 A1* | 8/2007 | Hendrix et al. ................ | 353/20 |
| 2008/0186576 A1* | 8/2008 | Takada .......................... | 359/492 |
| 2008/0199775 A1* | 8/2008 | Takezawa et al. ............ | 429/209 |
| 2008/0204635 A1* | 8/2008 | Van Popta et al. ............ | 349/96 |
| 2008/0268343 A1* | 10/2008 | Sato et al. ................ | 429/231.95 |
| 2009/0015733 A1* | 1/2009 | Chidate ............................. | 349/5 |
| 2009/0117472 A1* | 5/2009 | Iwamoto ...................... | 429/246 |
| 2009/0153961 A1* | 6/2009 | Murakami ........... | G02B 5/3025 359/485.05 |
| 2011/0102712 A1* | 5/2011 | Kumai ........................... | 349/96 |

OTHER PUBLICATIONS

International Search Report issued in International Patent Application No. PCT/JP2010/058835 dated Aug. 17, 2010.

* cited by examiner

WAVE PLATE HAVING CONSISTENT BIREFRINGENCE PROPERTIES ACROSS THE VISIBLE SPECTRUM AND MANUFACTURING METHOD FOR SAME

FIELD OF THE INVENTION

This invention relates to a wave plate having a birefringence film formed by an oblique vapor deposition process and a method of manufacturing such a wave plate.

BACKGROUND OF THE INVENTION

Conventionally, a wave plate is manufactured by using an inorganic optical single crystal, such as quartz or the like, and a polymeric oriented film in most cases. However, although the inorganic optical single crystal is superior in performances, durability and reliability for use as a wave plate, its material cost and processing cost are very high. Moreover, the polymeric oriented film tends to easily deteriorate upon application of heat and UV light rays thereto, and has a problem in its durability.

Non-Patent Document 1 has described a wave plate formed by utilizing a structural birefringence, and proposed that by transferring a metal mold having a structural birefringence shape onto a resin material by a nano-printing method, a wave plate is manufactured. More specifically, it is described that by etching a substrate using a dry etching method with a resin material being used as a mask material, the structural birefringence shape can be transferred onto a substrate surface.

In the technique described in this Non-Patent Document 1, however, since a transferring process and an etching process are carried out, complicated processes are required, and it is also necessary to produce a structural body having a very high aspect ratio. For this reason, high etching techniques, such as the use of a resin material that provides a sufficient selection ratio with respect to the substrate material and the improvement of verticality of etching, are required. Consequently, this method has a problem with productivity of a wave plate.

Moreover, Patent Documents 1 to 3 have proposed an optical element that is formed by vapor depositing particles onto a substrate in an oblique direction so as to provide an oblique columnar structure, and allowed to have a birefringence property relative to light rays vertically made incident on a substrate surface. This obliquely vapor deposited film (obliquely vapor deposited wave plate) having the oblique columnar structure, on principle, makes it possible to set an arbitrary phase difference by adjusting the film thickness. Moreover, this method easily provides a device with a large area, and makes is possible to reduce costs by mass production.

In particular, Patent Document 1 has described that an obliquely vapor deposited film, which is composed at least two layers by obliquely vapor depositing a material exerting a high wavelength dispersion and a material exerting a low wavelength dispersion in phase difference, is formed and that this film is allowed to function as a wave plate in a wide band of visible light rays. Further, Patent Document 3 has described that by using an alternate multilayered film between a high-refractive-index medium layer and a low-refractive-index medium layer having a periodic concave/convex shape, a wide operational wavelength can be determined.

However, the above-mentioned conventional obliquely vapor deposited film tends to have a high film thickness so as to achieve a desired birefringence quantity, making it difficult to provide a thin film.

PRIOR-ART DOCUMENTS

Patent Documents

PTL 1: Japanese Patent Application Laid-Open No. 11-23840
PTL 2: Japanese Patent Application Laid-Open No. 11-250483
PTL 3: WO No. 2004/113974

Non-Patent Document

Non-Patent Document 1: O. Masuda, H. Miyakoshi, M. Saito, M. Yamada, M. Yamada, KONICA MINOLTA TECHNOLOGY REPORT VOL. 5, 101-106 (2008)

SUMMARY OF THE INVENTION

The present invention has been devised in view of the above-mentioned circumstances, and its object is to provide a wave plate capable of increasing a birefringence quantity and making the film thickness thinner, and a method of manufacturing such a wave plate.

The present inventors have intensively carried out various researches and have found that by carrying out an obliquely vapor deposition process from two directions on a substrate on which convex and concave portions are formed with a period less than or equal to a wavelength of light to be used, fine grains of a dielectric material are stacked in a direction perpendicular to the surface of a substrate so that it is possible to increase a birefringence quantity and consequently to provide a thinner film.

That is, a wave plate in accordance with the present invention is characterized by including: a substrate on which periodic convex and concave portions, each having a period less than or equal to a wavelength of light to be used, are formed; columnar portions that are formed on each of the convex portions in a columnar shape by oblique vapor depositing processes of a dielectric material carried out in two directions, with fine grains of the dielectric material being stacked in a vertical direction relative to a surface of the substrate; and an interstice that is positioned on each of the concave portions, and formed between the columnar portions.

Moreover, a method of manufacturing a wave plate in accordance with the present invention is characterized by including the steps of: obliquely vapor depositing a dielectric material in two directions onto a substrate on which periodic convex and concave portions, each having a period less than or equal to a wavelength of light to be used, are formed; and forming a birefringence film that has columnar portions formed on each of the convex portions in a columnar shape by stacking fine grains of the dielectric material in a vertical direction relative to a surface of the substrate, and an interstice that is positioned on each of the concave portions and formed between the columnar portions.

Effects of Invention

In accordance with the present invention, it is possible to increase a birefringence quantity by utilizing a birefringence of fine grains derived from an oblique vapor deposition process and a birefringence derived from a fine structure of a substrate so that it becomes possible to make the wave plate into a thin film.

DETAILED DESCRIPTION OF THE INVENTION

Figure 1:
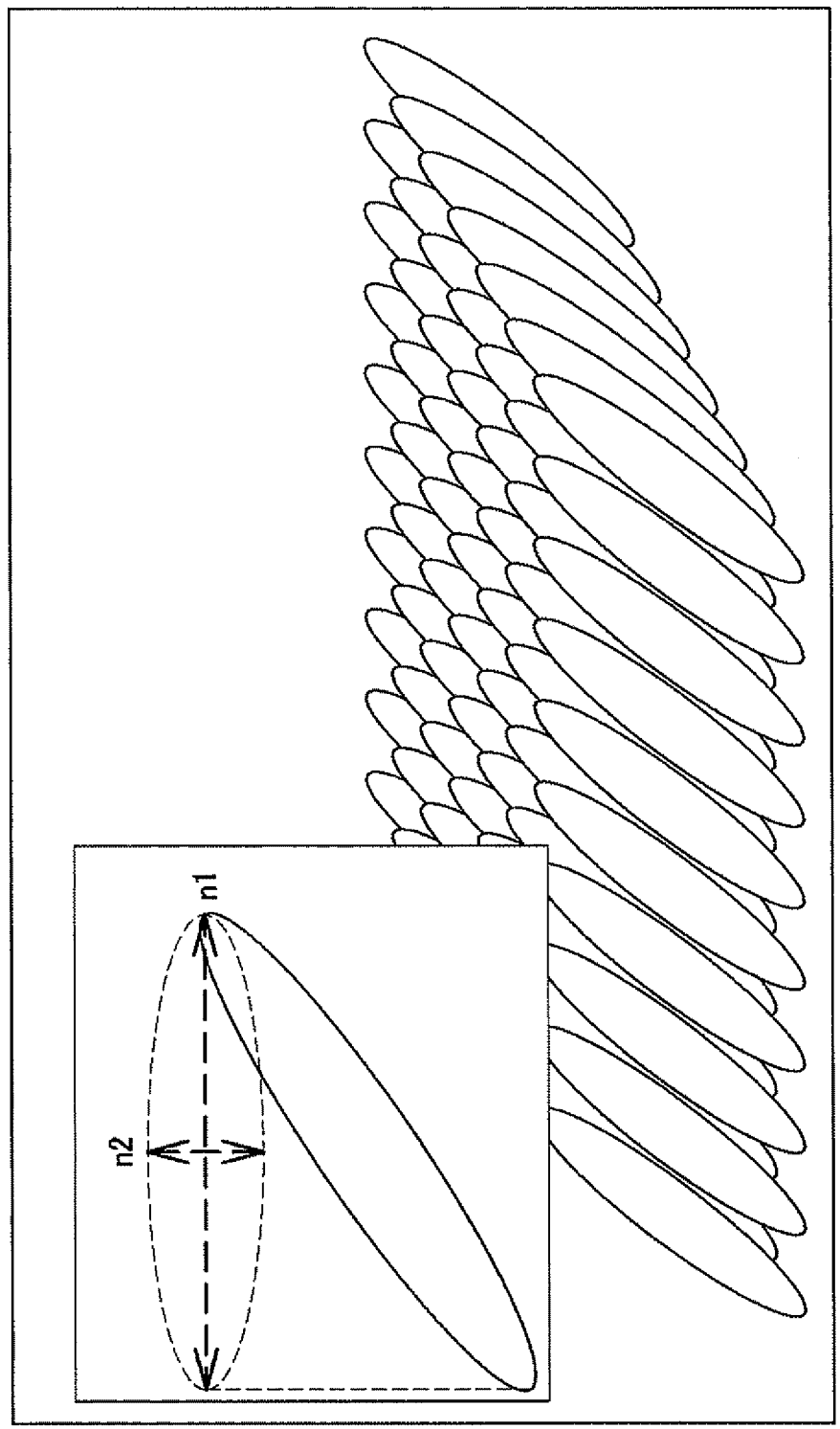
FIG. 1 is a drawing for explaining a shape anisotropy of fine grains of a dielectric material.

Referring to Figures, the following description will discuss an embodiment of the present invention in the following order in detail:
1. Wave plate
2. Method of manufacturing a wave plate
3. Examples 1. Wave Plate A wave plate shown as one embodiment of the present invention is designed to increase a birefringence quantity by utilizing a birefringence of fine grains derived from oblique vapor depositing processes and a birefringence derived from a fine structure. As shown in FIG. 1, the former birefringence is developed by a difference in refractive indexes between a major-axis direction n1 and a minor-axis direction n2 caused by a shape anisotropy of fine grains of a dielectric material. Moreover, the latter birefringence is developed by a shape anisotropy of for example, concave/convex portions formed on a substrate of the dielectric material.

Figure 2:
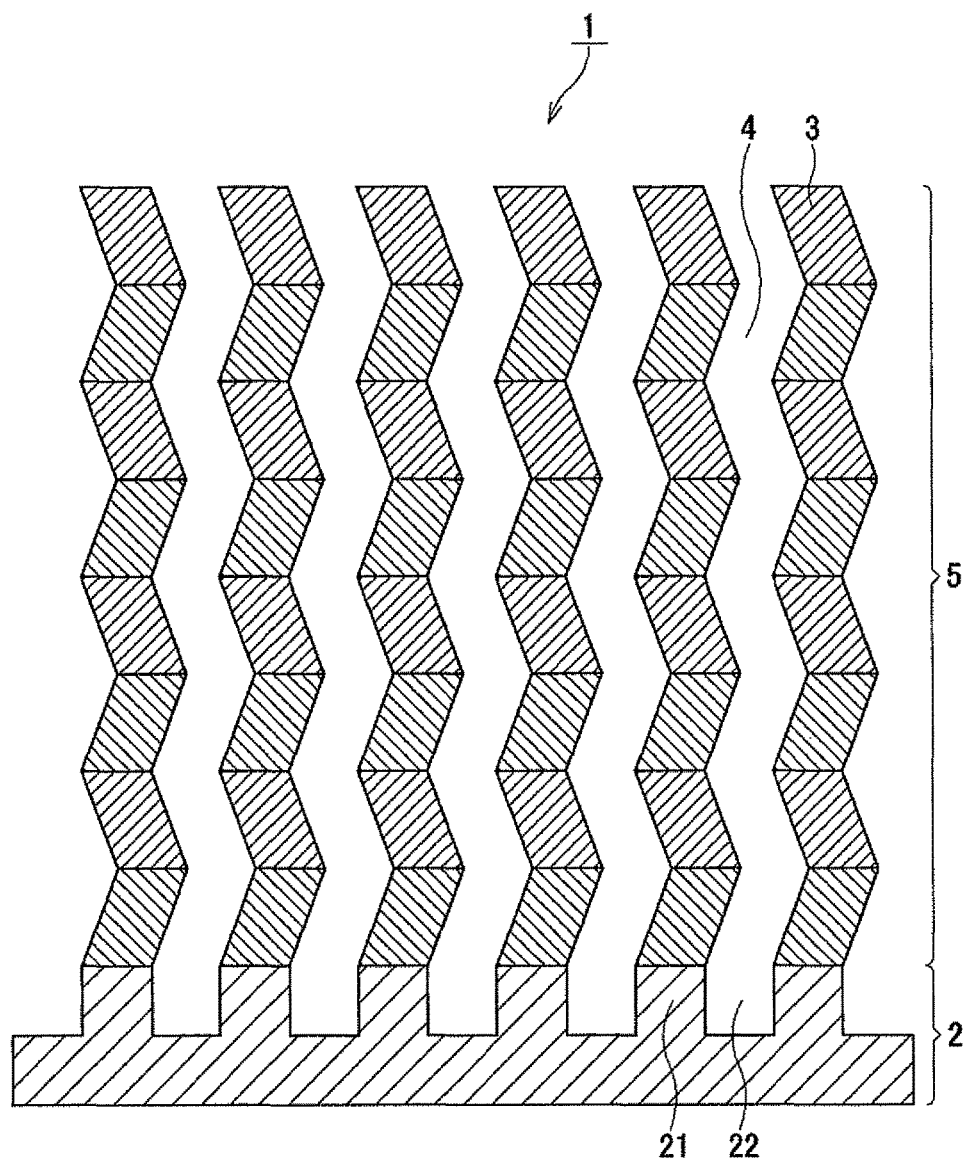
FIG. 2 is a cross-sectional view that shows an essential portion of a wave plate in accordance with one embodiment of the present invention.

FIG. 2 is a cross-sectional view showing an essential portion of the wave plate. This wave plate 1 is constituted by a substrate 2 on which periodic convex portions 21 and concave portions 22, each having a period shorter than a wavelength of light to be used, are formed, columnar portions 3 that are formed on each convex portion 21 in a columnar shape by using oblique vapor depositing processes of a dielectric material carried out in two directions and have a structure in which the fine grains of the dielectric material are stacked in a vertical direction relative to the substrate surface of the substrate 2, and an interstice 4 that is positioned on each concave portion 22, and formed between the columnar portions 3. Moreover, the columnar portions 3 and the interstice 4 form a birefringence film 5.

As the substrate 2, a transparent substrate, such as a glass substrate, a silicon substrate, a plastic substrate, or the like, is used, and among these, a quartz glass ($SiO_2$) substrate having less absorption in a visible light area (wavelength range: 380 nm to 780 nm) is more preferably used.

Figure 3A:
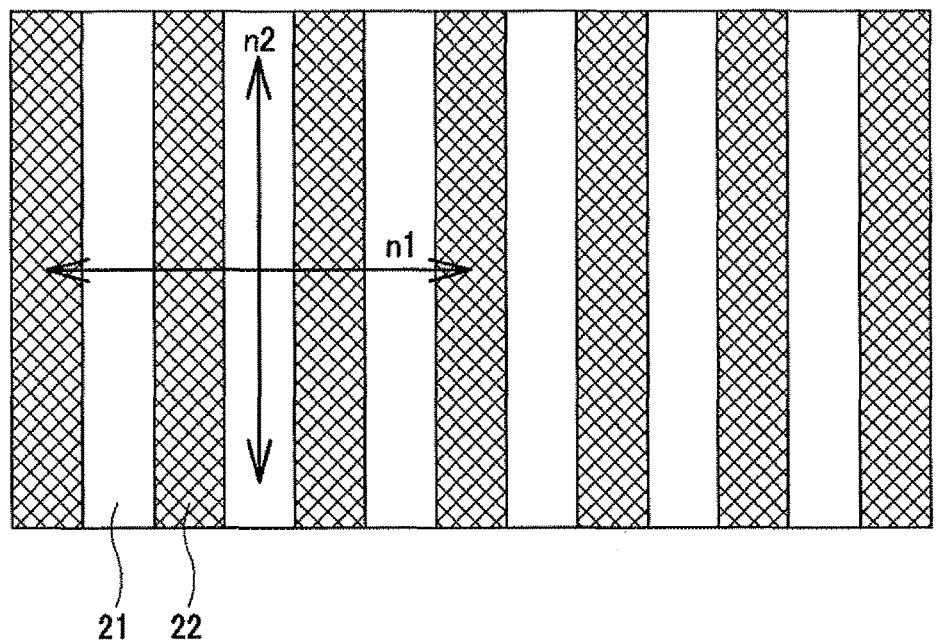
FIGS. 3A and 3B are drawings that show a structural example of a substrate.
Figure 3B:
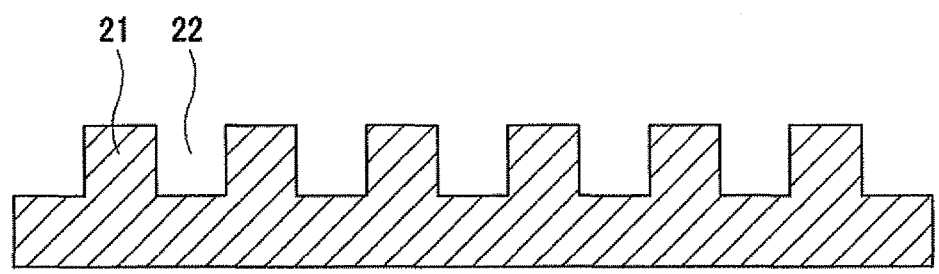

FIGS. 3A and 3B are a top view and a cross-sectional view that respectively show a structural example of the substrate 2. Supposing that an xy plane on x, y and z orthogonal coordinates is a substrate surface, convex portions 21 and concave portions 22 are formed on the substrate 2 in the x-axis direction, with periods (pitches) each shorter than a wavelength of light to be used. That is, on the substrate 2, a one-dimensional lattice (grid), which causes a difference in refractive indexes between the major axis direction n1 and the minor-axis direction n2 due to a path difference between the concave/convex structure, is formed.

Referring back to FIG. 2, the columnar portions 3 are composed of fine grains stacked by oblique vapor depositing processes of the dielectric material. As the dielectric material, a high refractive-index material containing, $Ta_2O_5$, $TiO_2$, $SiO_2$, $Al_2O_3$, $Nb_2O_5$, $MaF_2$ or the like, is used, and among these, a high refractive-index material containing $Ta_2O_5$ and having a refractive index of 2.25 is preferably used.

The columnar portions 3 are obtained by obliquely vapor depositing the dielectric material from two directions that are different by 180° on the xy plane supposing that the xy plane on x, y and z orthogonal coordinates is a substrate surface. These oblique vapor depositing processes are carried out from the two directions that are different by 180° from each other, alternately, as well as in a direction with a vapor deposition angle, for example, in a range from 60° to 80° relative to the z-axis, so that layers of fine grains are formed in the z-axis direction.

In this case, the thicknesses of the respective layers of the columnar portions 3 are preferably set to 50 nm or less, more preferably, to 10 nm or less. By making the thicknesses of the respective layers thinner as described above, a columnar shape that extends straightly in the z-axis direction is obtained, thereby providing an increased birefringence quantity.

The interstice 4 is an air layer formed between the columnar portions 3. The interstice 4 is formed by a so-called self-shadowing effect in which, since the fine grains of the dielectric material come flying in oblique directions, a shadow portion is formed to which the dielectric material is not allowed to directly adhere.

In accordance with the wave plate 1 in which the columnar portions 3 are formed on the convex portions 21 of the substrate 2 in the vertical direction to the substrate surface, while the interstice 4 is formed on each of the concave portions 22 of the substrate 2, it is possible to increase the birefringence quantity by utilizing a birefringence derived from fine grains of the dielectric material and a birefringence derived from a concave/convex structure of the substrate 2. Moreover, by using a high refractive-index material containing $Ta_2O_5$ as the dielectric material, it is possible to obtain a wave plate 1 having a birefringence quantity in a visible light area of 0.13 or more. Furthermore, it is possible to obtain a wave plate 1 having a superior wavelength dispersion property (wavelength dependence) in which the difference in birefringence quantities between arbitrary two wavelengths within the visible light area is 0.02 or less.

Additionally, for convenience of explanation, the structural example of the wave plate 1 shown in FIG. 2 has eight birefringence films formed by carrying out 4 cycles of oblique vapor depositing processes; however, not limited to this structure, birefringence films having as many as several hundred layers may be formed. Moreover, on each of the two surfaces or either one of the surfaces of the wave plate 1, an anti-reflection film (AR: Anti Reflection) may be formed.

2. Method of Manufacturing a Wave Plate

The following description will discuss a method of manufacturing a wave plate. Additionally, those structures that are the same as those of the wave plate shown in FIG. 2 and the substrate shown in FIG. 3 are indicated by the same reference numerals, and the explanation thereof will be omitted.

Figure 4:
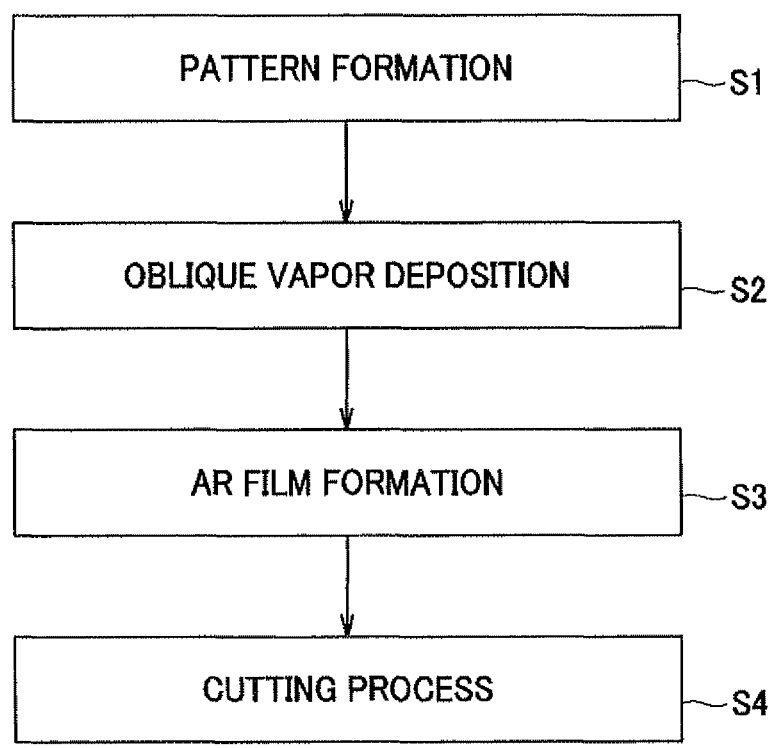
FIG. 4 is a flow chart that shows a method of manufacturing the wave plate in accordance with the embodiment of the present invention.

FIG. 4 is a flow chart that shows an example of a method of manufacturing a wave plate. First, in step S1, patterns of periodic convex portions 21 and concave portions 22, each having a period shorter than the wavelength of light to be used, are formed on a substrate 2. More specifically, supposing that an xy plane on x, y and z orthogonal coordinates is a substrate surface, convex portions 21 and concave portions 22 are formed thereon in the x-axis direction, with periods (pitches) each being shorter than a wavelength of light to be used. That is, a one-dimensional lattice (grid), which has a path difference due to the concave/convex structure, is formed on the substrate 2.

As the substrate 2, a transparent substrate, such as a glass substrate, a silicon substrate, a plastic substrate, or the like, is used, and among these, a quartz glass ($SiO_2$) having less absorption in a visible light area (wavelength range: 380 nm to 780 nm) is more preferably used. Moreover, a substrate on one surface of which an anti-reflection film is formed may be used.

As a method of forming the patterns, for example, a CVD (Chemical Vapor Deposition) method may be used in which $SiO_2$ is deposited and a photoresist pitch pattern is formed by photolithography, and an $SiO_2$ lattice pattern is formed by vacuum etching, with $CF_4$ being used as a reactive gas.

In step S2, a dielectric material is obliquely vapor deposited onto the substrate 2 on which periodic convex portions 21 and concave portions 22 having a period less than or equal to a wavelength of light to be used have been formed, from two directions. As the dielectric material, a high refractive-index material containing, $Ta_2O_5$, $TiO_2$, $SiO_2$, $Al_2O_3$, $Nb_2O_5$, $MaF_2$ or the like, is used, and among these, a high refractive-index material containing $Ta_2O_5$ having a refractive index of 2.25 is preferably used.

Figure 5:
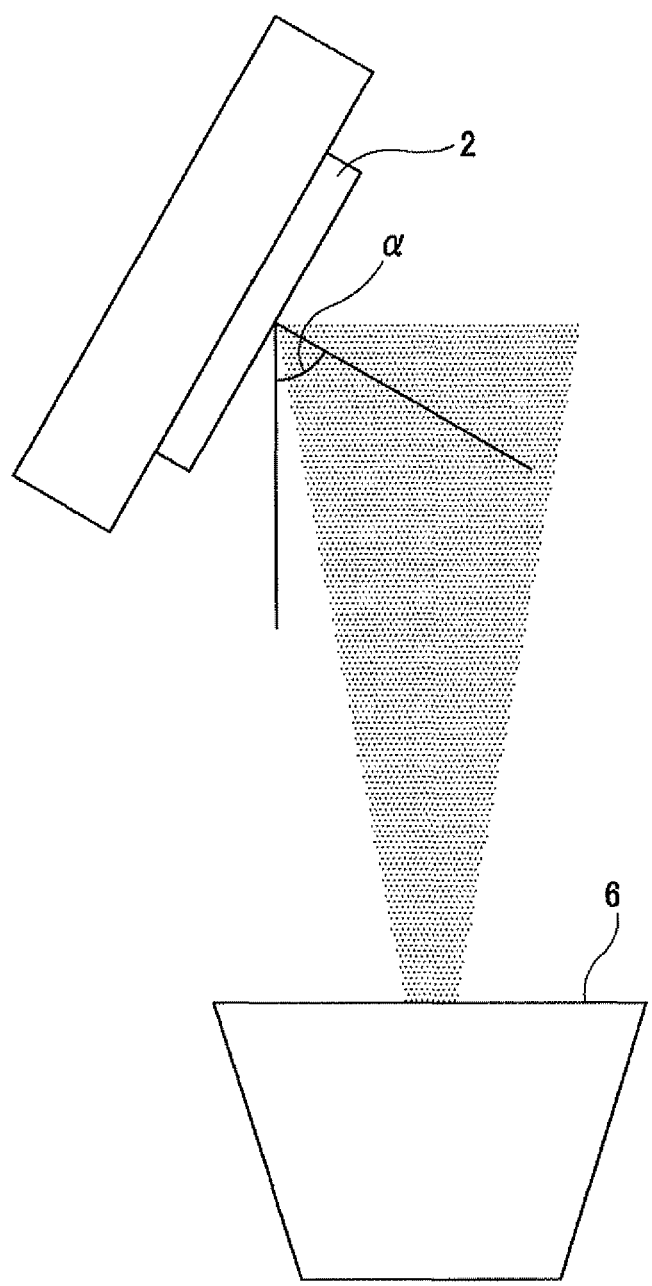
FIG. 5 is a drawing for explaining the outline of an oblique vapor deposition.

FIG. 5 is a drawing for explaining the outline of the oblique vapor deposition. The oblique vapor deposition is carried out by installing a vapor deposition source 6 in a direction of a vapor deposition angle $\alpha$ relative to the normal direction to the substrate 2 surface, and by altering the vapor deposition angle $\alpha$, the birefringence quantity of a film to be deposited is controlled. For example, in the case when a high refractive-index material containing $Ta_2O_5$ is used as the dielectric material, by setting the vapor deposition angle in a range from 60° to 80°, it becomes possible to increase the birefringence quantity.

Moreover, by vapor depositing the dielectric material in a direction perpendicular to the line of the periodic convex portions 21 and concave portions 22 on the substrate 2, that is, to the line of the one-dimensional lattice, it is possible to increase the birefringence quantity.

Furthermore, upon vapor depositing a plurality of layers, the dielectric material is obliquely vapor deposited from two directions that are different by 180° from each other on the xy plane supposing that the xy plane on x, y and z orthogonal coordinates is a substrate surface. For example, vapor depositing cycles in which, after having been obliquely vapor deposited in one of directions, the substrate 2 is rotated by 180° so that an oblique vapor deposition process is carried out in the other direction, are executed a plurality of times; thus, a film having multiple layers formed by being vapor deposited in the two directions can be obtained.

Moreover, by carrying out the vapor depositing cycles a plurality of times, with the thicknesses of the respective layers being set to 50 nm or less, more preferably, to 10 nm or less, a columnar shape that extends straightly in the z-axis direction can be obtained so that an increased birefringence quantity is achieved.

In step S3, an AR film is formed on the birefringence film. As the AR film, a generally-used multilayer film composed of a high refractive-index film and a low refractive-index film may be used.

In step S4, the wave plate is cut into a predetermined size. In the cutting process, a cutting apparatus such as a glass scriber may be used.

In this manner, by using the substrate on which the periodic convex portions 21 and concave portions 22 having a period less than or equal to a wavelength of light to be used, the birefringence film, which has the columnar portions that are stacked on convex portions 21 in a columnar shape by oblique vapor deposition and the interstice that is located on each concave portion and formed between columnar portions, is formed so that it is possible to increase a birefringence quantity by utilizing a birefringence derived from fine grains of a dielectric material and a birefringence derived from a concave/convex structure of the substrate 2.

In the above-mentioned example, the one-dimensional lattice is used; however, as long as it has a period less than or equal to a wavelength of light to be used, a random pattern may be used, or a pattern forming system using a block copolymer described in Non-Patent Document 1, that is, a system in which $SiO_2$ is film-formed on a glass substrate in the same manner as described above, a pattern is formed by the block copolymer so that the pattern of the block copolymer is transferred on $SiO_2$ may be used. Moreover, without film-forming $SiO_2$, the pattern may be directly formed on glass.

EXAMPLES

3. Examples

Referring to examples, the following description will discuss the present invention more specifically; however, the present invention is not intended to be limited by these examples.

A glass ($SiO_2$) substrate was used as the substrate, and $SiO_2$ was deposited on the substrate with a thickness of 100 nm by a CVD method, and a photoresist pitch pattern was formed by photolithography. Then, by a vacuum etching process using $CF_4$ as a reactive gas, a one-dimensional lattice pattern having a pitch of 150 nm and a depth of 50 nm was formed.

In the following description, the substrate with the one-dimensional lattice pattern formed thereon (hereinafter, referred to also as a one-dimensional lattice substrate) was used, and evaluations were made on vapor deposition conditions of the oblique vapor deposition, wavelength dependence, the effects of the fine pattern, and the birefringence film made of a plurality of layers.

[Vapor Deposition Conditions]

Figure 6:
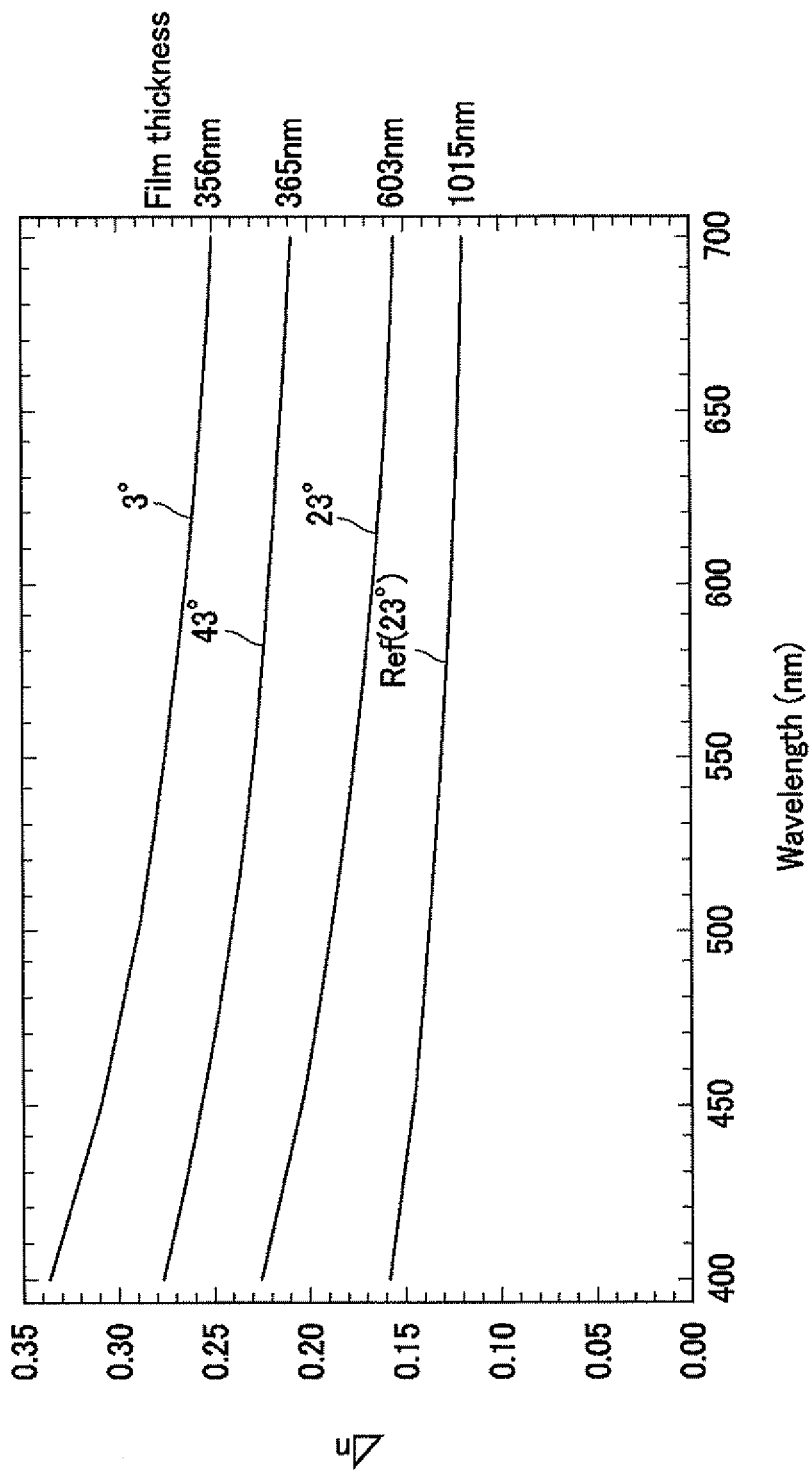
FIG. 6 is a graph that shows a relationship between the rotation angle of a substrate and a birefringence quantity Δn.
Figure 7:
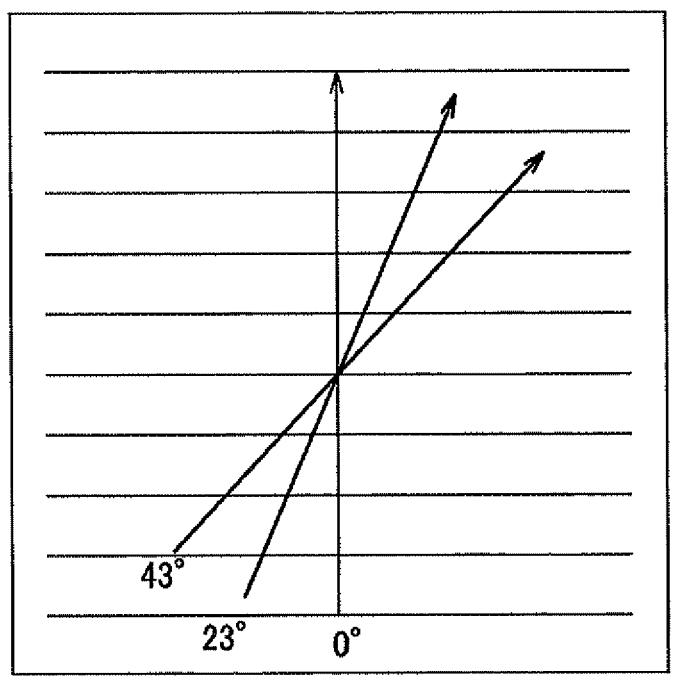
FIG. 7 is a drawing for explaining an incident direction onto a one-dimensional lattice substrate.

FIG. 6 is a graph that shows a relationship between the rotation angles of the substrate and a birefringence quantity Δn. Oblique vapor deposition processes were carried out to form only one layer of a birefringence film for each of cases of incident angles of 3°, 23° and 43° supposing that as shown in FIG. 7, the incident angle perpendicular to lines of the one-dimensional lattice (grid) is 0°. As the dielectric material, $Ta_2O_5$ was used. Moreover, the vapor deposition angle relative to the normal direction to the substrate surface was set to 70°.

As indicated by FIG. 6, by carrying out the vapor deposition in a direction perpendicular to the lines of the one-dimensional lattice on the substrate, it was possible to increase the birefringence quantity.

Figure 8:
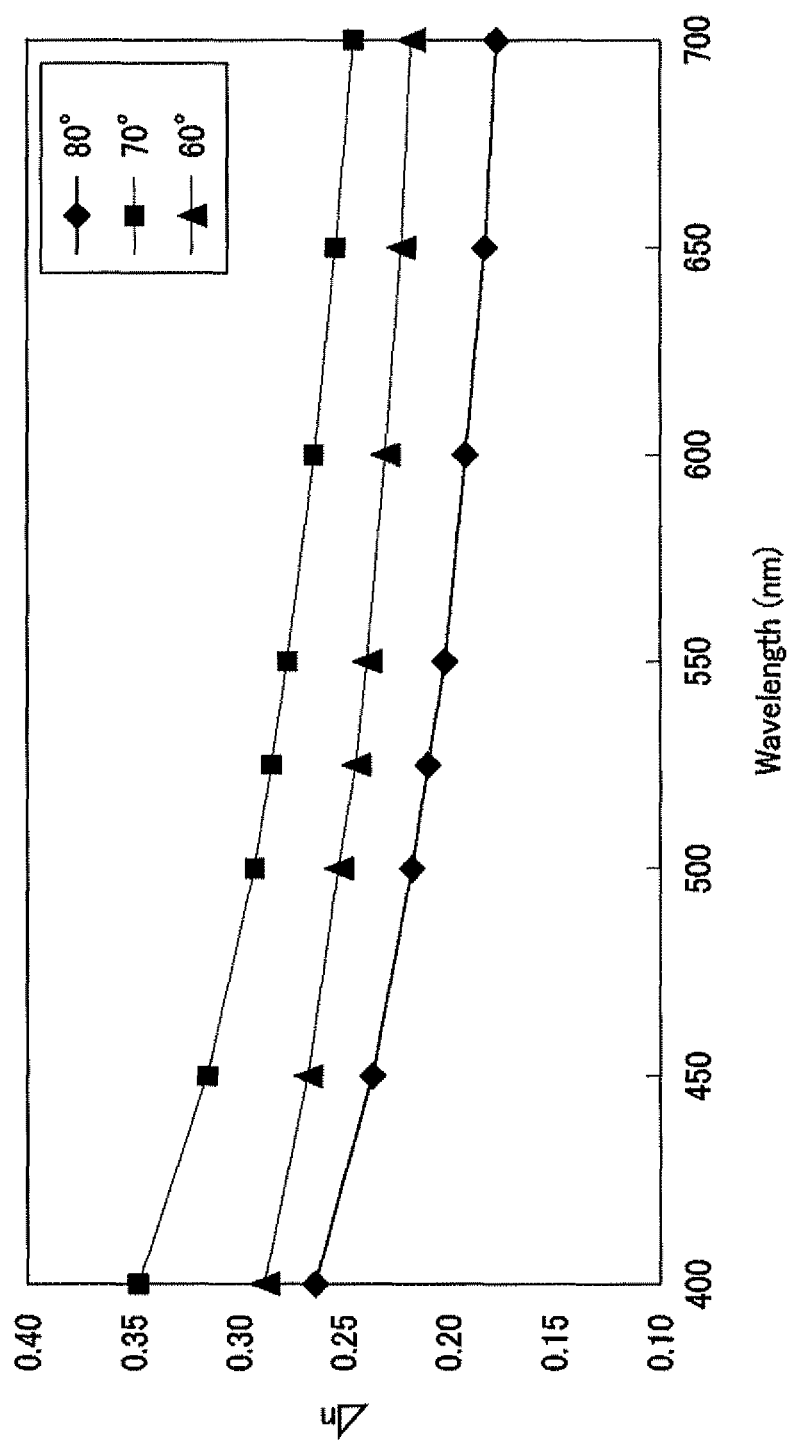
FIG. 8 is a graph that shows a relationship between the incident angle and the birefringence quantity Δn.
Figure 9:
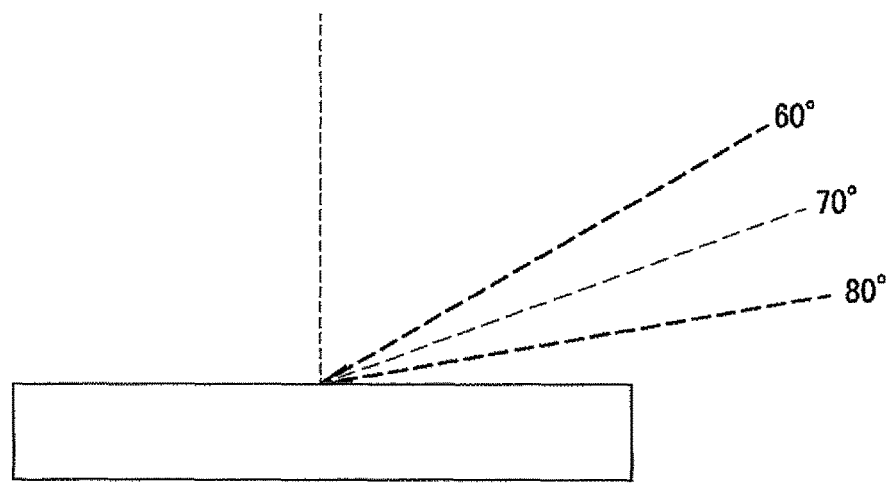
FIG. 9 is a drawing for explaining an incident angle relative to a substrate surface.

FIG. 8 is a graph that shows a relationship between incident angles and a birefringence quantity Δn. As shown in FIG. 9, oblique vapor depositing processes were carried out to form only one layer of a birefringence film, with the vapor deposition angle relative to the normal direction to the substrate surface being set to 60°, 70° and 80°. Moreover, the incident angle perpendicular to the grid lines was set to 3°. As the dielectric material, $Ta_2O_5$ was used, and the film thickness of the birefringence film was set to 356 nm.

The results shown in FIG. 8 indicate that it is possible to increase the birefringence quantity by setting the vapor deposition angle relative to the normal direction to the substrate surface in a range from 60° to 80°.

That is, it is found that the birefringence quantity can be increased by carrying out the oblique vapor deposition of $Ta_2O_5$ in a direction perpendicular to the lines of the one-dimensional lattice, with the vapor deposition angle relative to the normal direction to the surface of a substrate being also set in a range from 60° to 80°.

[Wavelength Dependence]

Next, the wavelength dependence of the birefringence film obtained by the oblique vapor deposition was evaluated. The oblique vapor depositing processes were carried out in a direction perpendicular to the lines of the one-dimensional lattice, with the vapor deposition angle relative to the normal direction to the substrate surface being also set to 70°, so that only one layer of a birefringence film was formed. As the dielectric material, $Ta_2O_5$ was used, and the film thickness of the birefringence film was set to 1.2 µm.

Figure 10:
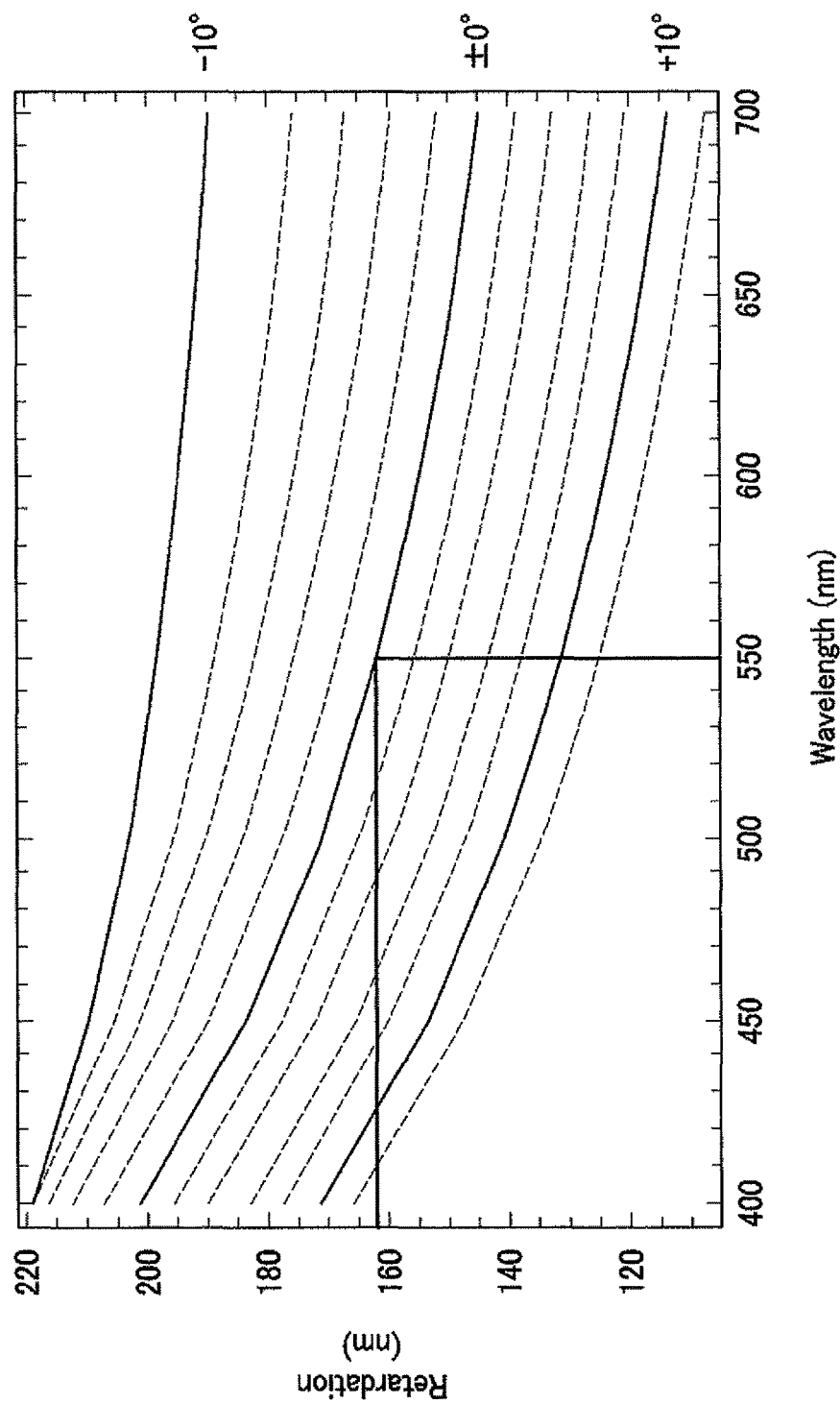
FIG. 10 is a graph that shows a relationship between a retardation value and a wavelength.
Figure 11C:
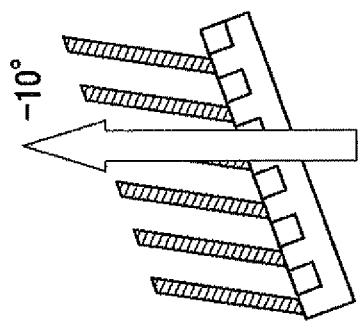
FIGS. 11A to 11C are drawings for explaining a rake angle of a substrate.
Figure 11B:
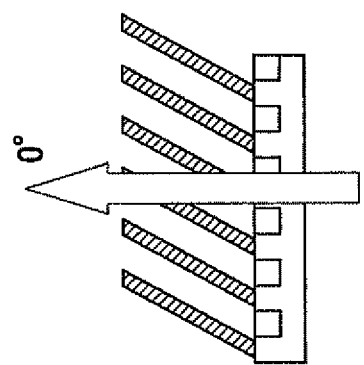
Figure 11A:
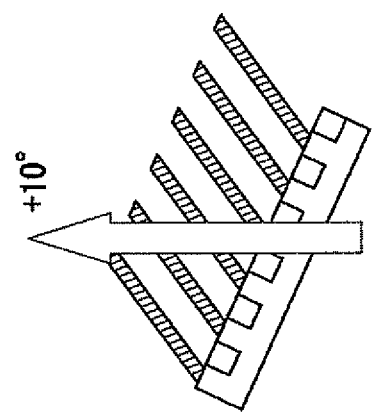

FIG. 10 is a graph that shows a relationship between a retardation value and a wavelength. As shown in FIGS. 11A to 11C, the rake angle of the substrate was controlled, and a retardation (Re) was measured.

$$Re=\Delta n \cdot d (\Delta n: \text{birefringence quantity}, d: \text{film thickness})$$

The results shown in FIG. 10 indicate that the wavelength dependence can be controlled by the rake angle. For example, in the case when the wave plate is allowed to function as a λ/4 wave plate on a wavelength of 550 nm, since it is required to satisfy Δn·d/λ=0.25, the rake angle can be set to 0°.

[Effects of Fine Pattern]

Next, effects of the fine pattern formed on the substrate were evaluated. The oblique vapor depositing processes were carried out in a direction perpendicular to the lines of the one-dimensional lattice, with the vapor deposition angle relative to the normal direction to the substrate surface being also set to 70°, so that only one layer of a birefringence film was formed. As the dielectric material, $Ta_2O_5$ was used, and the film thickness of the birefringence film was set to 1.2 µm. Moreover, in the same manner as in these processes, by using a flat substrate (hereinafter, referred to also as a flat substrate) with no pattern formed thereon, a birefringence film was formed on this flat substrate.

Figure 12:
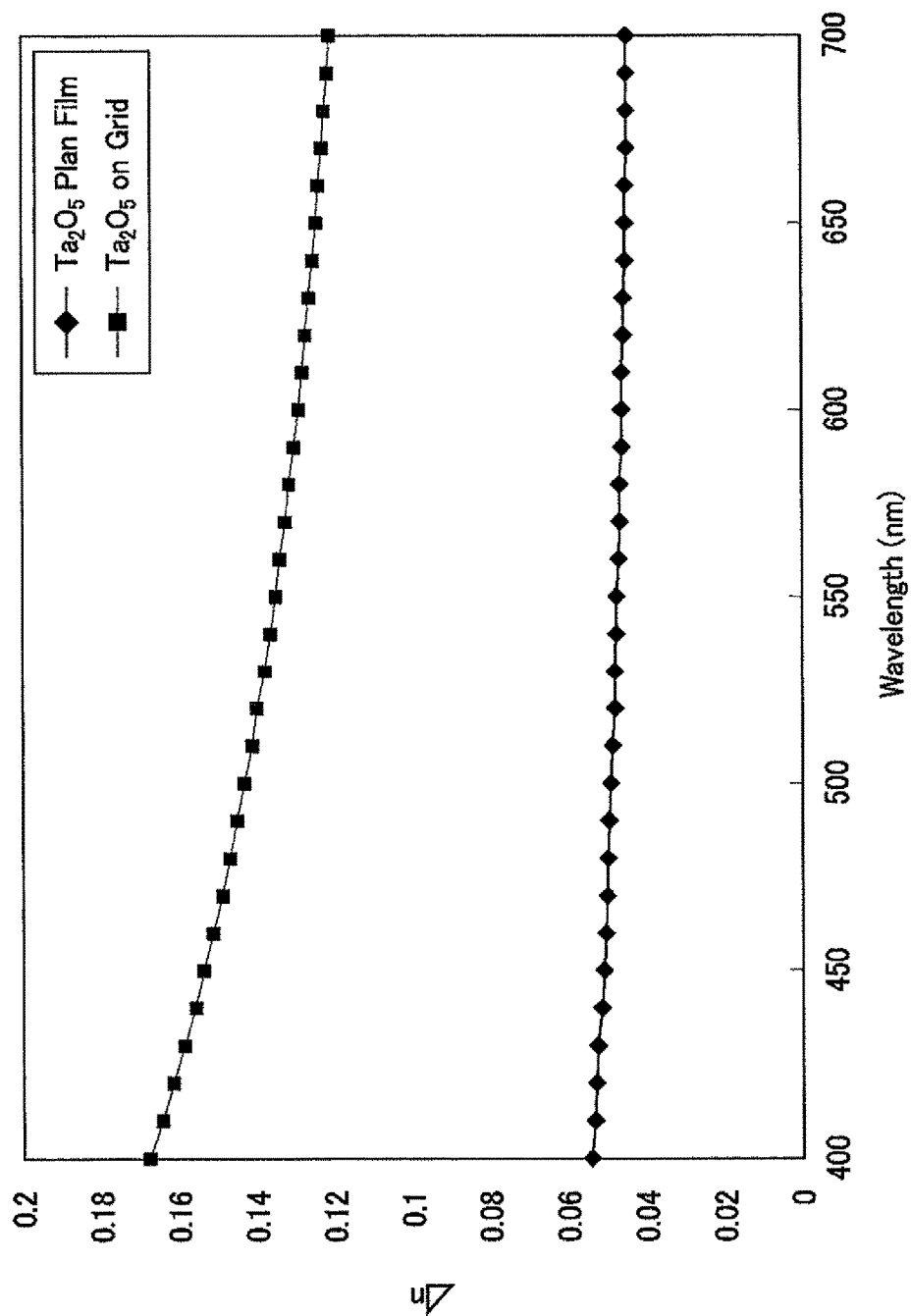
FIG. 12 is a graph that shows the results of comparison between a wave plate using a one-dimensional lattice substrate and a wave plate using a flat substrate.
Figure 13:
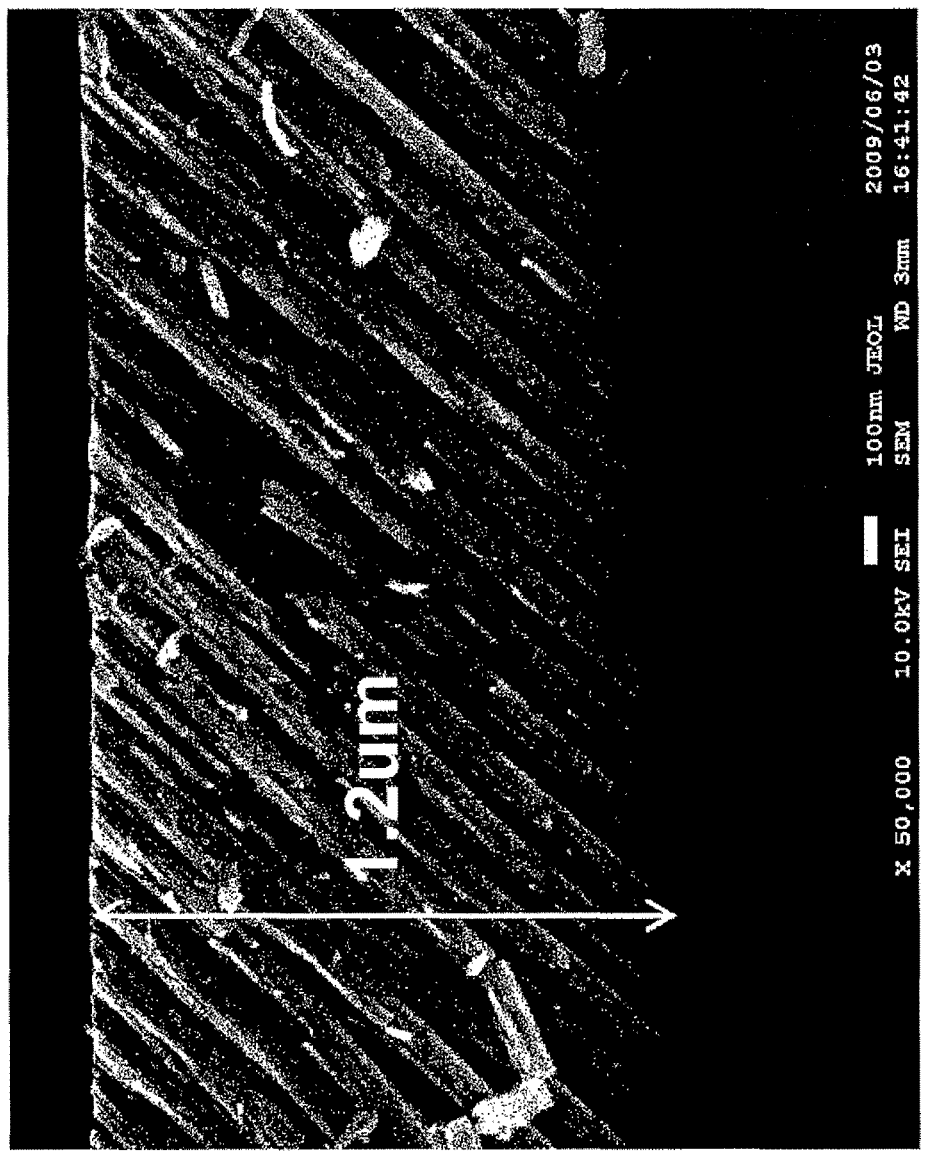
FIG. 13 is an SEM image of a cross section of the wave plate using the one-dimensional lattice substrate.

FIG. 12 is a graph that shows the results of comparison between a wave plate using a one-dimensional lattice substrate and a wave plate using a flat substrate. Moreover, FIG. 13 is an SEM (Scanning Electron Microscope) image of a cross section of the wave plate using the one-dimensional lattice substrate.

In comparison with the oblique vapor deposition using a conventional flat substrate, the wave plate using the one-dimensional lattice made it possible to increase the birefringence quantity 2.8 times higher. This effect is considered to be obtained because of the structure in which the film is formed on the one-dimensional lattice substrate so that interstices are formed between the lattices, with the effect of a structural birefringence being further added thereto.

In accordance with the wave plate using such a one-dimensional lattice substrate, a thinner film structure in comparison with a conventional structure may be used to obtain a desired phase characteristic. Moreover, by the thinner film structure, many advantages, such as high-speed and highly effective production processes, a reduction of materials costs for film formation, or the like, are achieved.

[Birefringence Film Composed of a Plurality of Layers]

Next, $Ta_2O_5$ was obliquely vapor deposited in two directions so that a birefringence film composed of a plurality of layers was formed on a one-dimensional lattice substrate. The oblique vapor depositing processes were carried out in two directions, that is, in a direction perpendicular to the lines of the one-dimensional lattice and in a direction with the vapor deposition angle relative to the normal direction to the substrate surface being set to 70°. More specifically, vapor depositing cycles in which, after having been obliquely vapor deposited in one of directions, the substrate was rotated by 180° so that an oblique vapor deposition process was carried out in the other direction, were executed a plurality of times; thus, a birefringence film composed of a plurality of layers was formed.

Figure 14:
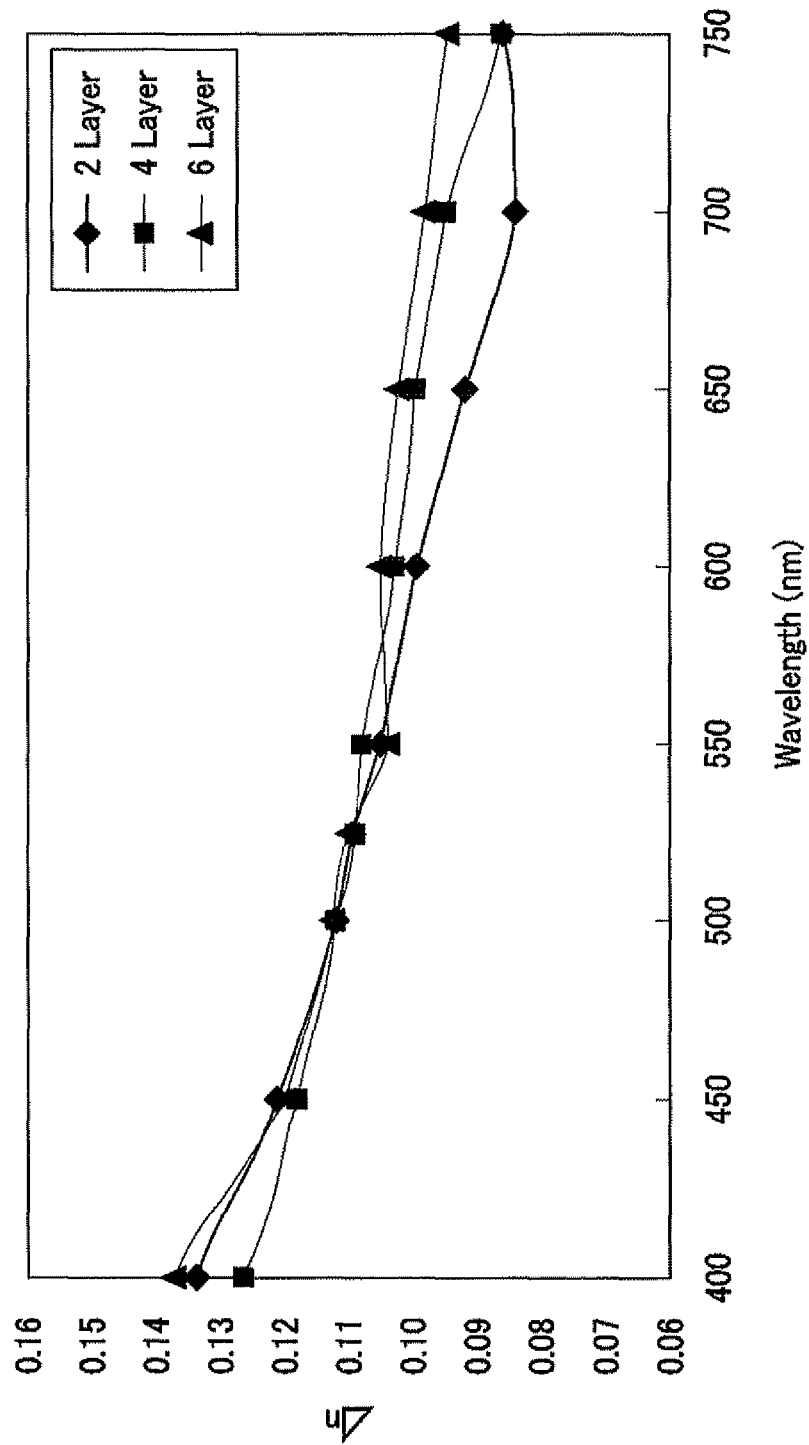
FIG. 14 is a graph that shows a relationship between the number of stacked layers and Δn when the thickness is made constant.
Figure 15:
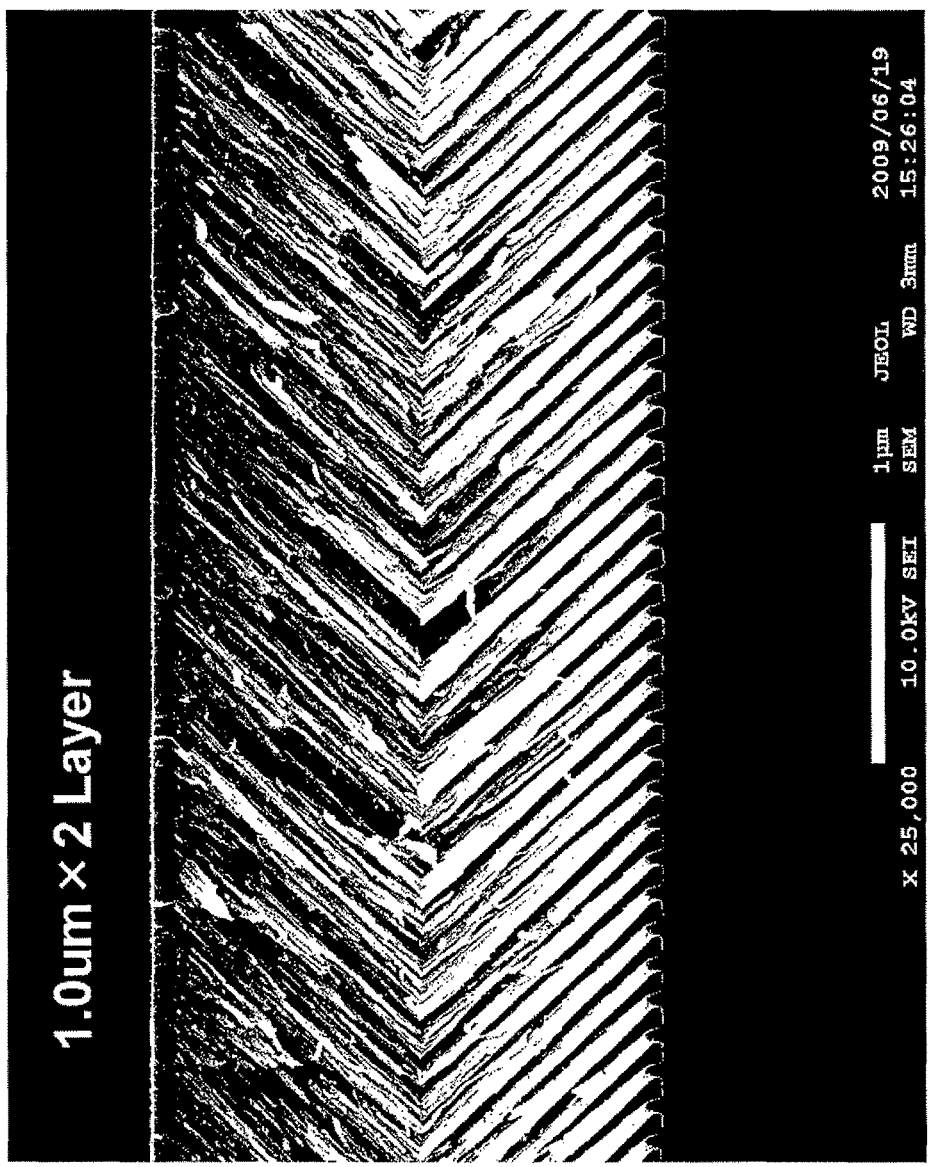
FIG. 15 is an SEM image showing a cross section of a wave plate in which two birefringence films (1.0 μm×2) are formed.
Figure 16:
FIG. 16 is an SEM image showing a cross section of a wave plate in which four birefringence films (0.5 μm×4) are formed.
Figure 17:
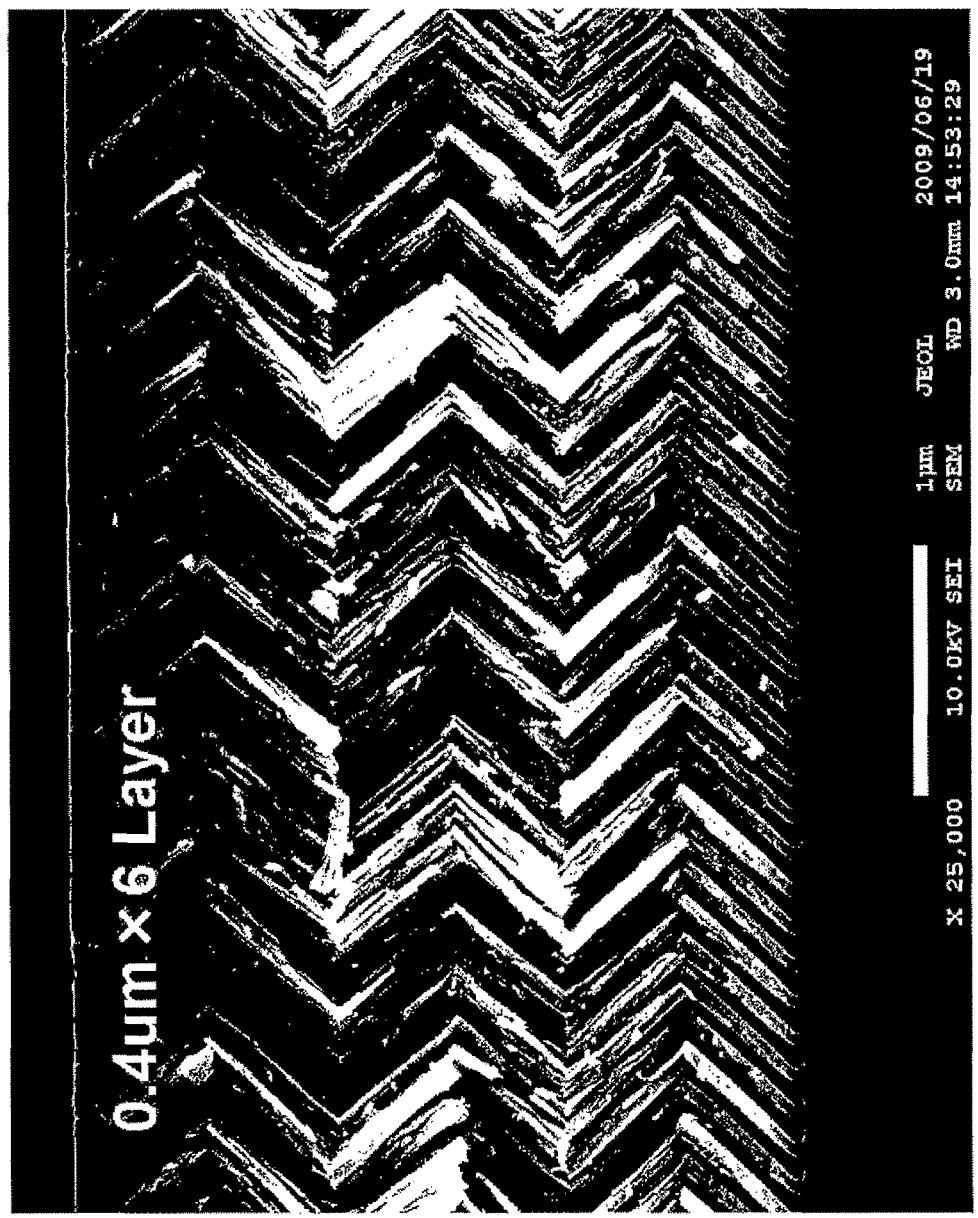
FIG. 17 is an SEM image showing a cross section of a wave plate in which six birefringence films (0.4 μm×6) are formed.

FIG. 14 is a graph that shows a relationship between the number of stacked layers and Δn when the thickness is made constant. Moreover, FIGS. 15 to 17 are respectively SEM images showing cross sections of wave plates in which two birefringence films (1.0 µm×2), four birefringence films (0.5 µm×4) and six birefringence films (0.4 µm×6) are formed.

The results shown in FIG. 14 indicate that the wave dependence can be improved by increasing the number of stacked layers of birefringence films.

Therefore, by further increasing the number of stacked layers, wavelength dependences were evaluated between a case where a one-dimensional lattice substrate was used and a case where a flat substrate was used.

Figure 18:
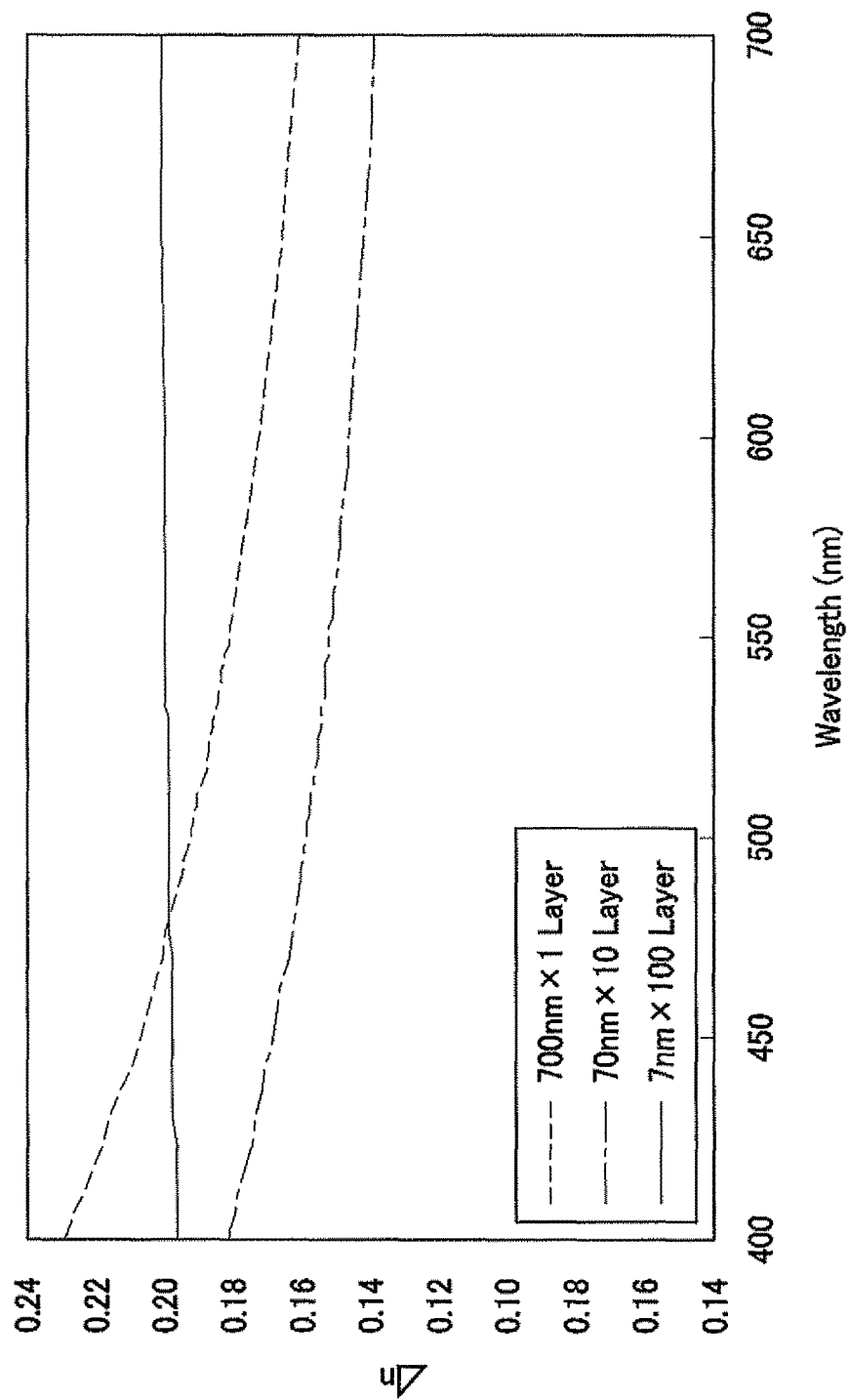
FIG. 18 is a graph that shows a relationship between the number of stacked layers and Δn when a one-dimensional lattice substrate is used.
Figure 19:
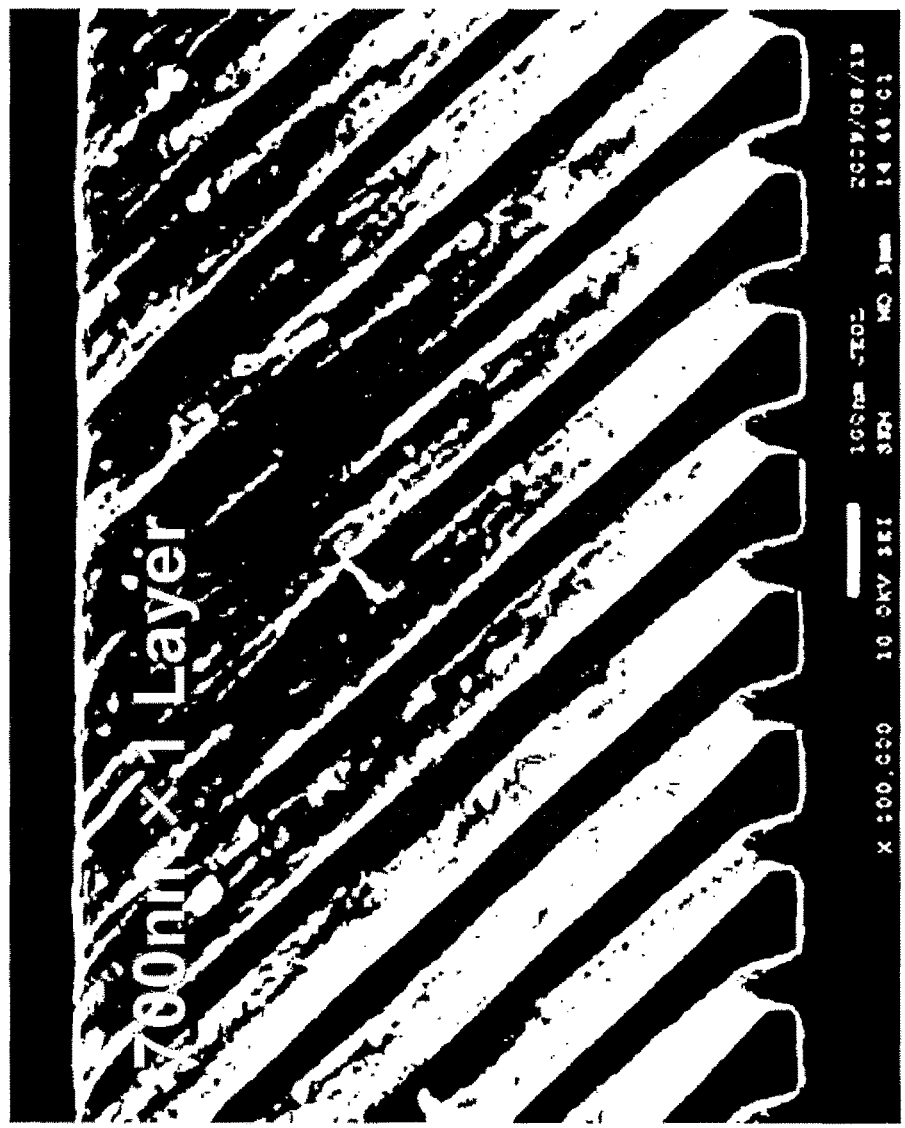
FIG. 19 is an SEM image showing a cross section of a wave plate in which one birefringence film (700 nm×1) is formed on a one-dimensional lattice substrate.
Figure 20:
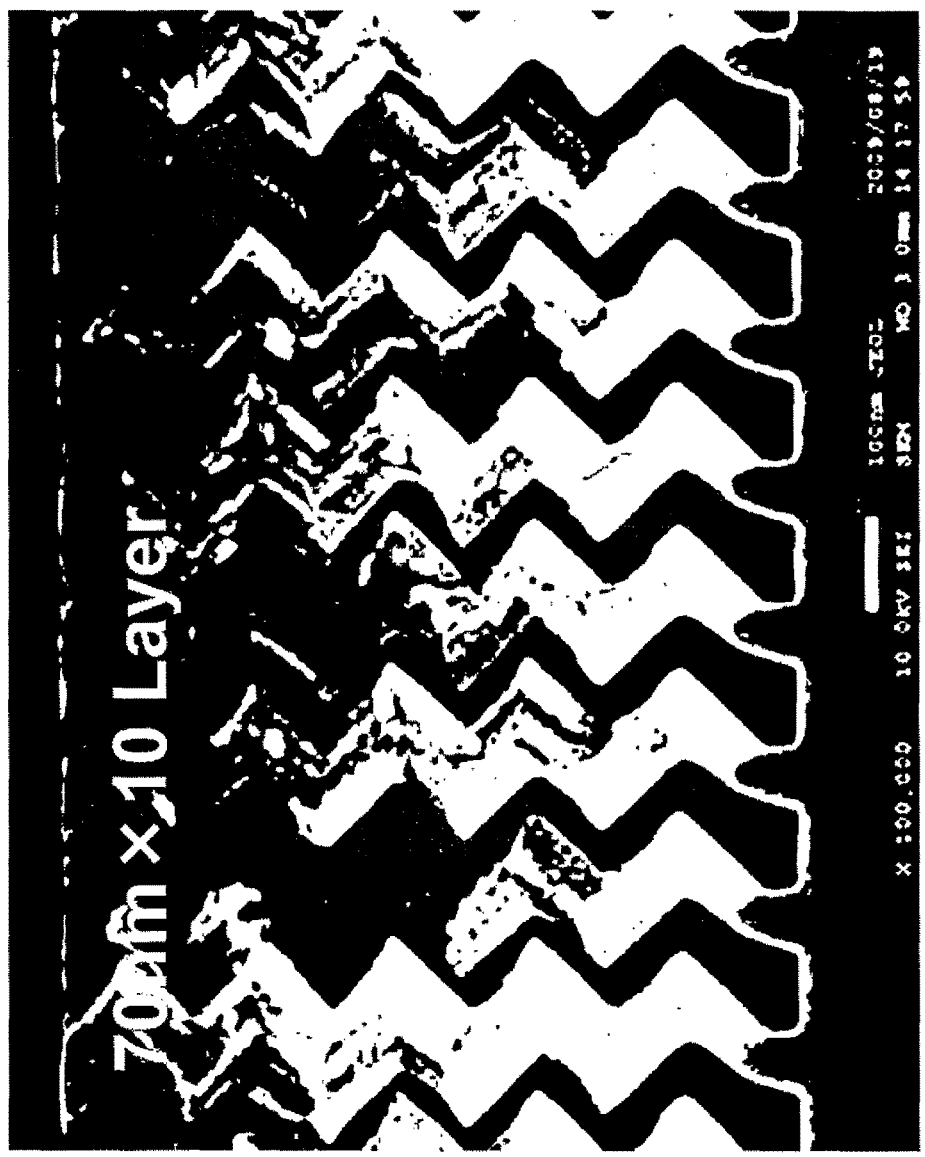
FIG. 20 is an SEM image showing a cross section of a wave plate in which ten birefringence films (70 nm×10) are formed on the one-dimensional lattice substrate.
Figure 21:
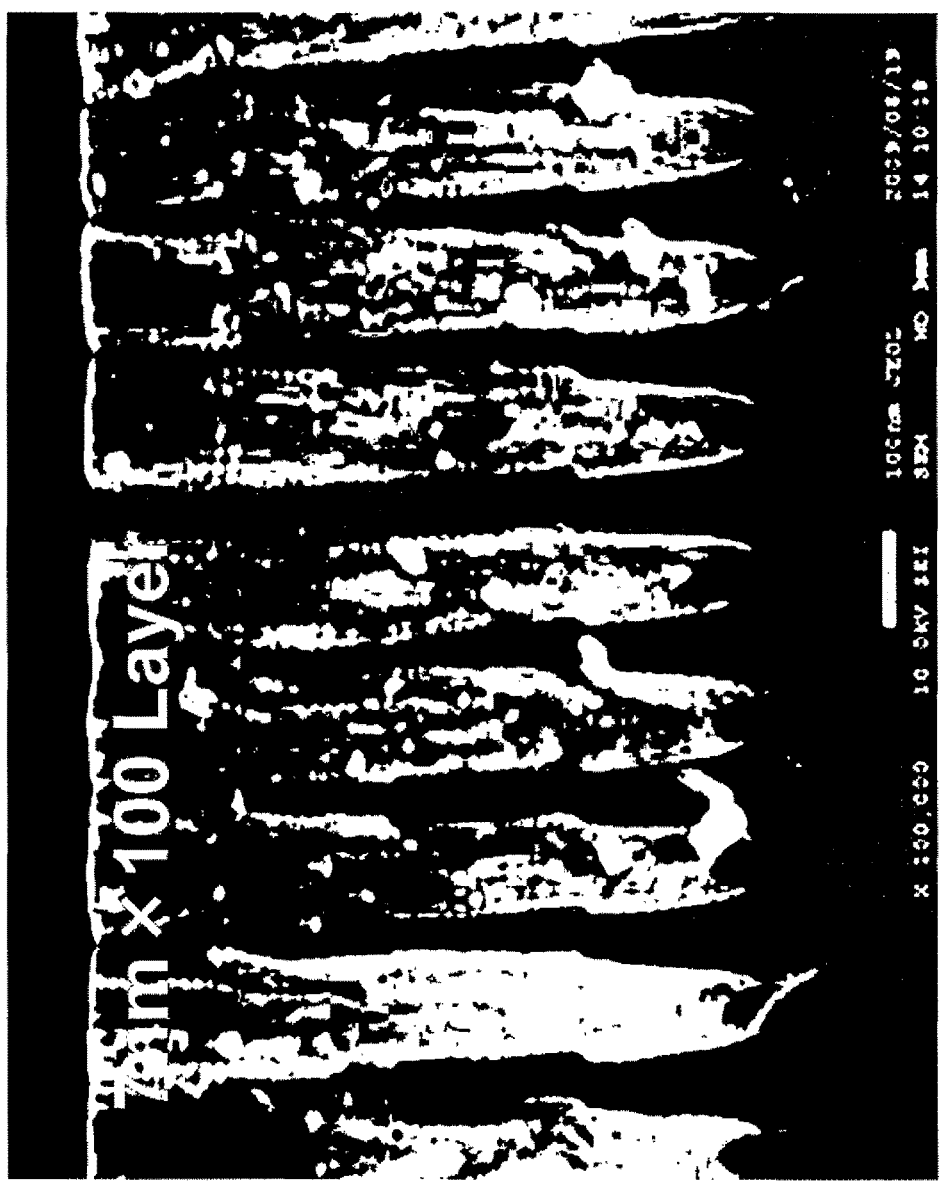
FIG. 21 is an SEM image showing a cross section of a wave plate in which 100 birefringence films (7 nm×100) are formed on the one-dimensional lattice substrate.

FIG. 18 is a graph that shows a relationship between the number of stacked layers and Δn when a one-dimensional lattice substrate is used. Moreover, FIGS. 19 to 21 are SEM images showing cross sections of wave plates in which on one-dimensional lattice substrates, one birefringence film (700 nm×1), 10 birefringence films (70 nm×10) and 100 birefringence films (7 nm×100) are respectively formed.

Figure 22:
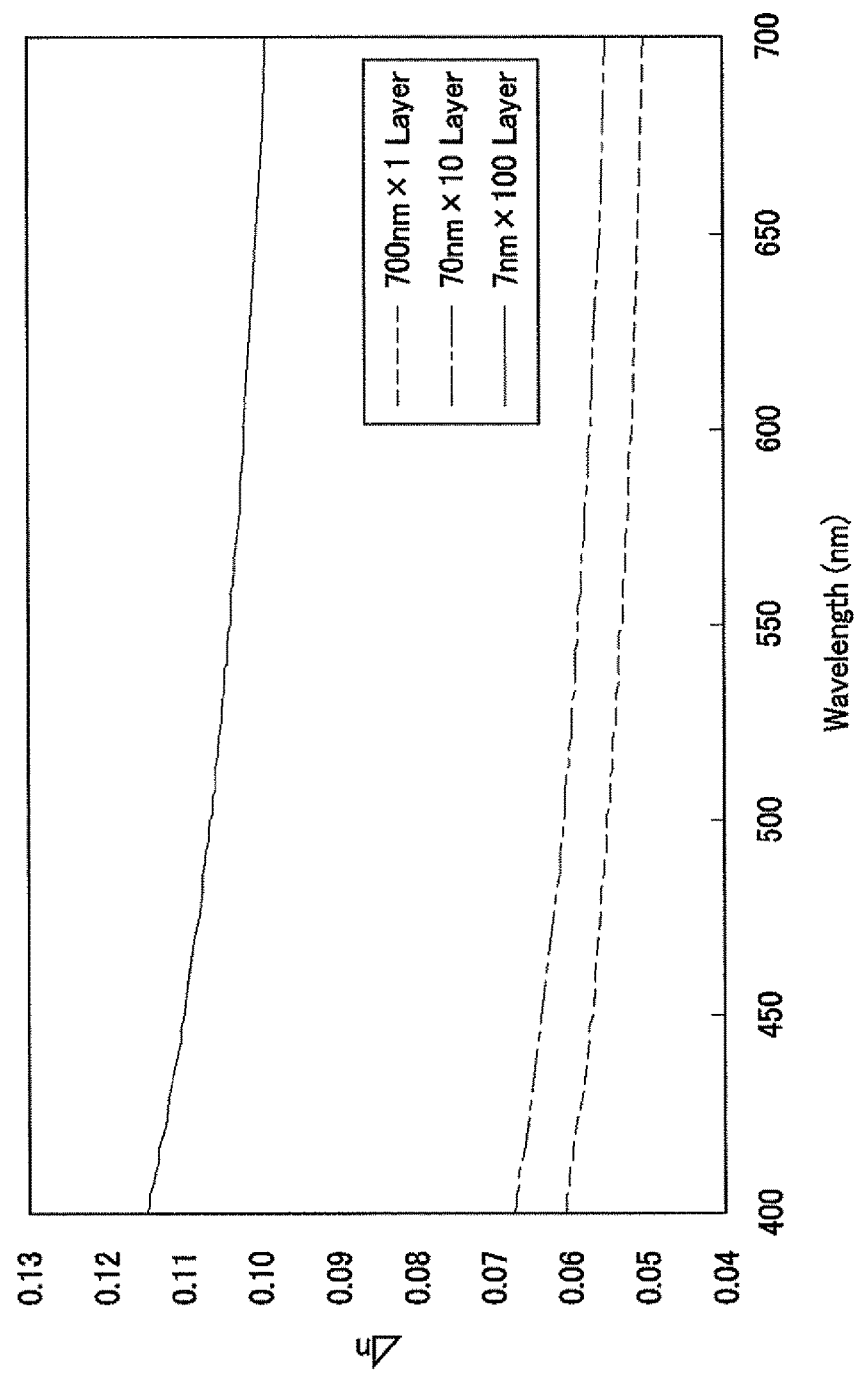
FIG. 22 is a graph that shows a relationship between the number of stacked layers and Δn when a flat substrate is used.
Figure 23:
FIG. 23 is an SEM image showing a cross section of a wave plate in which one birefringence film (700 nm×1) is formed on a flat substrate.
Figure 24:
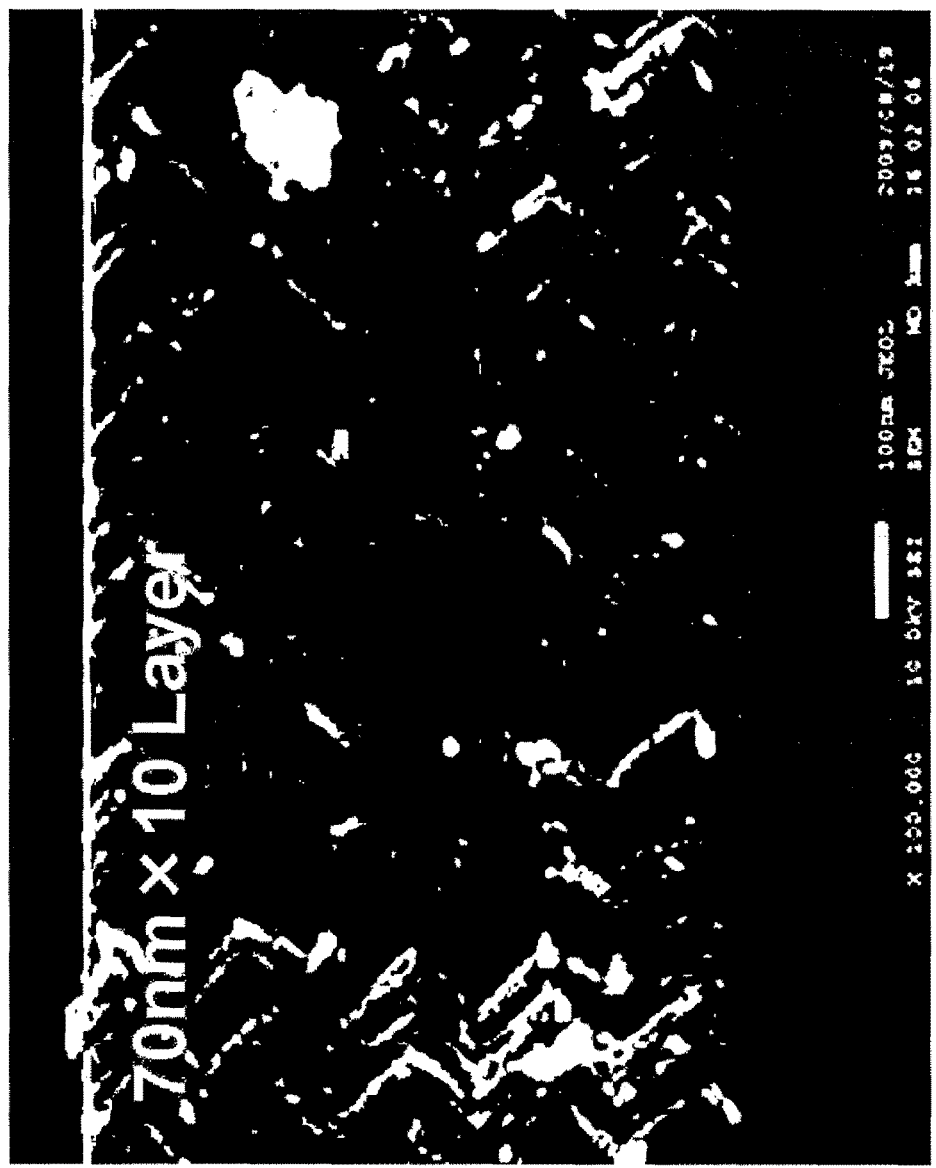
FIG. 24 is an SEM image showing a cross section of a wave plate in which ten birefringence films (70 nm×10) are formed on the flat substrate.
Figure 25:
FIG. 25 is an SEM image showing a cross section of a wave plate in which 100 birefringence films (7 nm×100) are formed on the flat substrate.

On the other hand, FIG. 22 is a graph that shows a relationship between the number of stacked layers and Δn when a flat substrate is used. Moreover, FIGS. 23 to 25 are SEM images showing cross sections of wave plates in which on flat substrates, one birefringence film (700 nm×1), 10 birefringence films (70 nm×10) and 100 birefringence films (7 nm×100) are respectively formed.

By clearly indicated upon comparing the graphs shown in FIG. 18 and FIG. 22 with each other, the structure in which a birefringence film composed of a plurality of layers is formed on the one-dimensional lattice substrate provides a greater birefringence quantity than that of a structure in which a birefringence film composed of a plurality of layers is formed on the flat substrate. This effect is derived from a birefringence caused by the fine grains of the dielectric material and a birefringence caused by the concave/convex structure of the substrate.

Moreover, the results shown in FIG. 18 indicate that by alternately carrying out oblique vapor depositing processes in two directions, a plurality of layers are formed so that the wavelength dependence (wavelength dispersion) can be improved. As clearly clarified by the SEM images of the cross sections of wave plates shown in FIGS. 23 to 25, this effect is derived from that fact that $Ta_2O_5$ is staked on each convex portion in a columnar shape in a direction perpendicular to the substrate surface. In other words, since a columnar shape that extends straightly can be obtained by making the thicknesses of the respective layers thinner, the thickness of each layer is preferably set to 50 nm or less, more preferably, to 10 nm or less. Thus, the wavelength dependence is improved, and the birefringence quantity is also increased so that the wave plate can be made thinner.

Moreover, the results shown in FIG. 18 also indicate that by using a high refractive-index material containing $Ta_2O_5$ as the dielectric material, it is possible to obtain a wave plate having a birefringence quantity in a visible light area of 0.13 or more. It is found that, in particular, in accordance with a birefringence film having 100 layers (7 nm×100), with each layer being set to have a thickness of 10 nm or less, a superior wavelength dispersion property (wavelength dependence) is obtained in which the difference in birefringence quantities between arbitrary two wavelengths within the visible light area is 0.02 or less.

INDUSTRIAL APPLICABILITY

By combining a birefringence derived from fine grains of a dielectric material with a birefringence derived from a concave/convex structure of the substrate, it is possible to provide a wave plate having high heat resistance, which has higher performances and is less expensive than a conventional wave plate. In particular, in the case of using this for a liquid crystal projector, since the resulting wave plate can deal with high optical density, it becomes possible to achieve a small size of an optical unit.

REFERENCE SIGNS LIST

1 . . . Wave plate, 2 . . . Substrate, 3 . . . Columnar portion, 4 . . . Interstice, 5 . . . Birefringence film, 6 . . . Vapor deposition source, 21 . . . Convex portion, 22 . . . Concave portion

The invention claimed is:

1. A wave plate composed of:
a substrate on which periodic convex and concave portions are formed in a lattice shape, each of the periodic convex and concave portions having a period less than or equal to a wavelength of light;
columnar portions that are formed only on each of the convex portions in a columnar shape by oblique vapor depositing a dielectric material carried out alternately in two directions different from each other by 180°, with fine grains of the dielectric material being stacked in a vertical direction relative to a surface of the substrate, the wave plate having a birefringence quantity of 0.13 or more within a visible light area, the dielectric material containing $Ta_2O_5$, each layer of the dielectric material of the columnar portions having a thickness of 10 nm or less, wherein the number of layers of the dielectric material is substantially greater than 10 such that birefringence quantities of the wave plate between two arbitrary wavelengths within the visible light area have a difference of 0.02 or less;
an interstice in the dielectric material that is positioned on each of the concave portions, the interstice being formed between the columnar portions such that the dielectric material is only disposed on the columnar portions formed on the convex portions.

2. A method of manufacturing a wave plate composed of the steps of:
obliquely vapor depositing a dielectric material alternately in two directions different from each other by 180° onto a substrate on which periodic convex and concave portions are formed in a lattice shape, each of the periodic convex and concave portions having a period less than or equal to a wavelength of light;
forming a birefringence film that has columnar portions formed only on each of the convex portions in a columnar shape by stacking fine grains of the dielectric material in a vertical direction relative to a surface of the substrate, the wave plate having a birefringence quantity of 0.13 or more within a visible light area, the dielectric material containing $Ta_2O_5$, each layer of the dielectric material of the columnar portions having a thickness of 10 nm or less, wherein the number of layers of the dielectric material is substantially greater than 10 such that birefringence quantities of the wave plate between two arbitrary wavelengths within the visible light area have a difference of 0.02 or less;

forming an interstice in the dielectric material that is positioned on each of the concave portions, the interstice being formed between the columnar portions such that the dielectric material is only disposed on the columnar portions formed on the convex portions.

3. The method of manufacturing a wave plate according to claim 2, wherein the obliquely vapor depositing step in two directions is carried out in a direction perpendicular to lines of the lattice shape of the periodic convex and concave portions, as well as in a direction with a vapor deposition angle relative to a normal direction to the surface of the substrate in a range from 60° to 80°.

* * * * *